US009576892B2

(12) United States Patent
Chi et al.

(10) Patent No.: US 9,576,892 B2
(45) Date of Patent: Feb. 21, 2017

(54) SEMICONDUCTOR DEVICES AND METHODS OF FORMING SAME

(71) Applicant: Taiwan Semiconductor Manufacturing Company, Ltd., Hsin-Chu (TW)

(72) Inventors: Chih-Chien Chi, Hsin-Chu (TW); Huang-Yi Huang, Hsin-Chu (TW); Szu-Ping Tung, Taipei (TW); Ching-Hua Hsieh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 100 days.

(21) Appl. No.: 14/021,649

(22) Filed: Sep. 9, 2013

(65) Prior Publication Data
US 2015/0069620 A1 Mar. 12, 2015

(51) Int. Cl.
*H01L 23/522* (2006.01)
*H01L 23/532* (2006.01)
*H01L 21/768* (2006.01)

(52) U.S. Cl.
CPC ..... *H01L 23/5226* (2013.01); *H01L 21/76843* (2013.01); *H01L 21/76849* (2013.01); *H01L 21/76868* (2013.01); *H01L 23/53295* (2013.01); *H01L 21/76805* (2013.01); *H01L 23/53223* (2013.01); *H01L 23/53238* (2013.01); *H01L 2924/0002* (2013.01)

(58) Field of Classification Search
CPC ............. H01L 23/5226; H01L 21/7685; H01L 23/53295; H01L 23/53238; H01L 23/53223; H01L 21/76843; H01L 21/76844; H01L 21/76855; H01L 21/76856; H01L 21/76873; H01L 21/76831; H01L 21/76805; H01L 21/76807; H01L 21/76838
USPC .......... 257/774, E21.575, E21.577, E21.578, 257/E21.579, E21.584, E21.585, 758, 257/762, E21.582, E23.145; 438/653, 438/625, 629, 643, 644, 656
See application file for complete search history.

(56) References Cited

U.S. PATENT DOCUMENTS

| 2005/0184288 A1* | 8/2005 | Bao ................ H01L 21/31116 257/40 |
| 2006/0118962 A1* | 6/2006 | Huang ............. H01L 21/76805 257/760 |
| 2008/0096384 A1* | 4/2008 | Anderson et al. ............ 438/653 |

(Continued)

OTHER PUBLICATIONS

K. Lee et al, Characteristics of Ti-Capped Co Films Deposited by a Remote Plasma ALD Method Using Cyclopentadienylcobalt Dicarbonyl, Journal of the Electrochemical Society, The Electrochemical Society, Inc., pp. H899-H903, vol. 154, No. 10, 2007.*

(Continued)

*Primary Examiner* — David Vu
*Assistant Examiner* — Mouloucoulaye Inoussa
(74) *Attorney, Agent, or Firm* — Slater Matsil, LLP

(57) ABSTRACT

Embodiments of the present disclosure include a semiconductor device and methods of forming the same. An embodiment is a method for of forming a semiconductor device, the method including forming a first conductive feature over a substrate, forming a dielectric layer over the conductive feature, and forming an opening through the dielectric layer to the first conductive feature. The method further includes selectively forming a first capping layer over the first conductive feature in the opening, and forming a second conductive feature on the first capping layer.

20 Claims, 8 Drawing Sheets

(56) References Cited

U.S. PATENT DOCUMENTS

2010/0081271 A1\* 4/2010 Ishizaka ............ H01L 21/76831
              438/622

OTHER PUBLICATIONS

Lee, K., et al., "Characteristics of Cobalt Films Deposited by Using a Remote Plasma ALD Method with a CpCo (CO2) Precursor," Journal of the Korean Physical Society, vol. 50, No. 4, Apr. 2007, pp. 1141-1146.

\* cited by examiner

SEMICONDUCTOR DEVICES AND METHODS OF FORMING SAME

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area.

Conductive materials such as metals or semiconductors are used in semiconductor devices for making electrical connections for the integrated circuits. For many years, aluminum was used as a metal for conductive materials for electrical connections, and silicon dioxide was used as an insulator. However, as devices are decreased in size, the materials for conductors and insulators have changed, to improve device performance.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
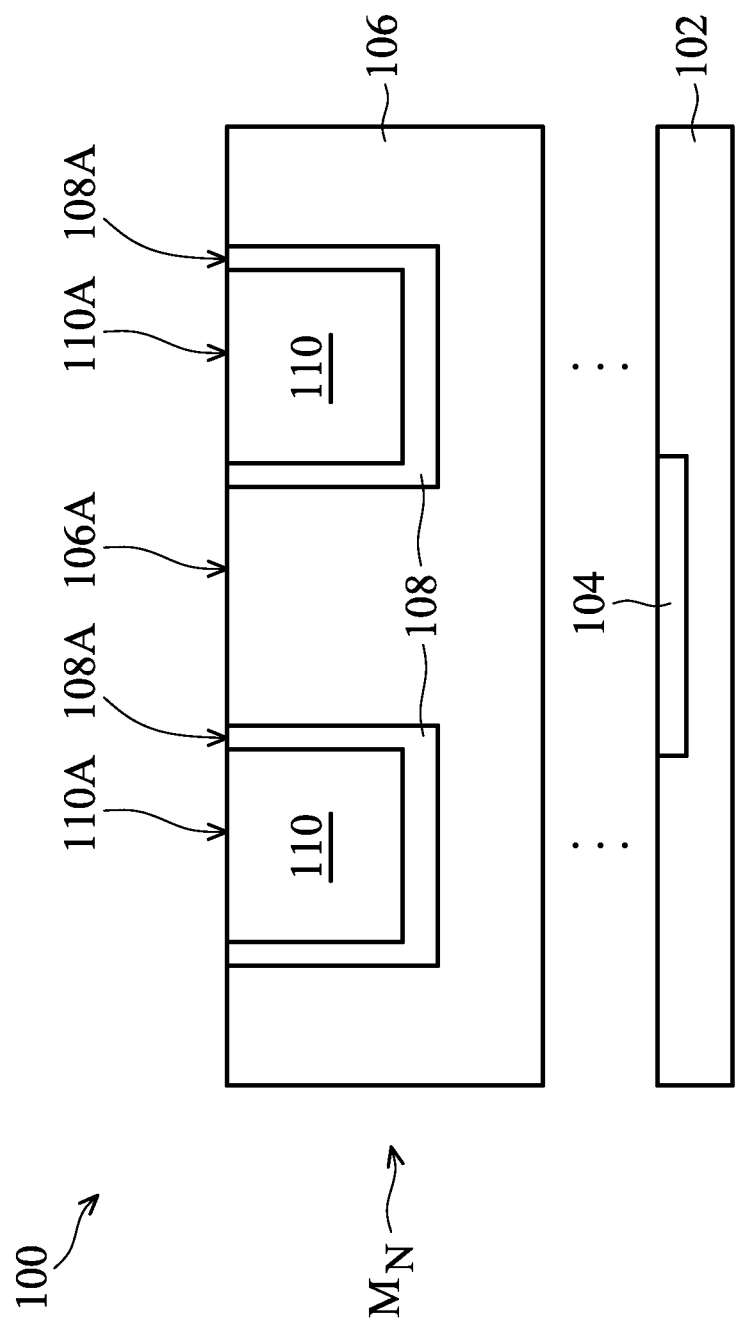
FIGS. 1 through 6 are cross-sectional views of intermediate stages in the manufacturing of a semiconductor device in accordance with an embodiment.

Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

Embodiments will be described with respect to a specific context, namely a method of a selective repairing of a capping and a conductive layer. Other embodiments may also be applied, however, to other layers or structures which may benefit from a selective repairing process.

Figure 5:
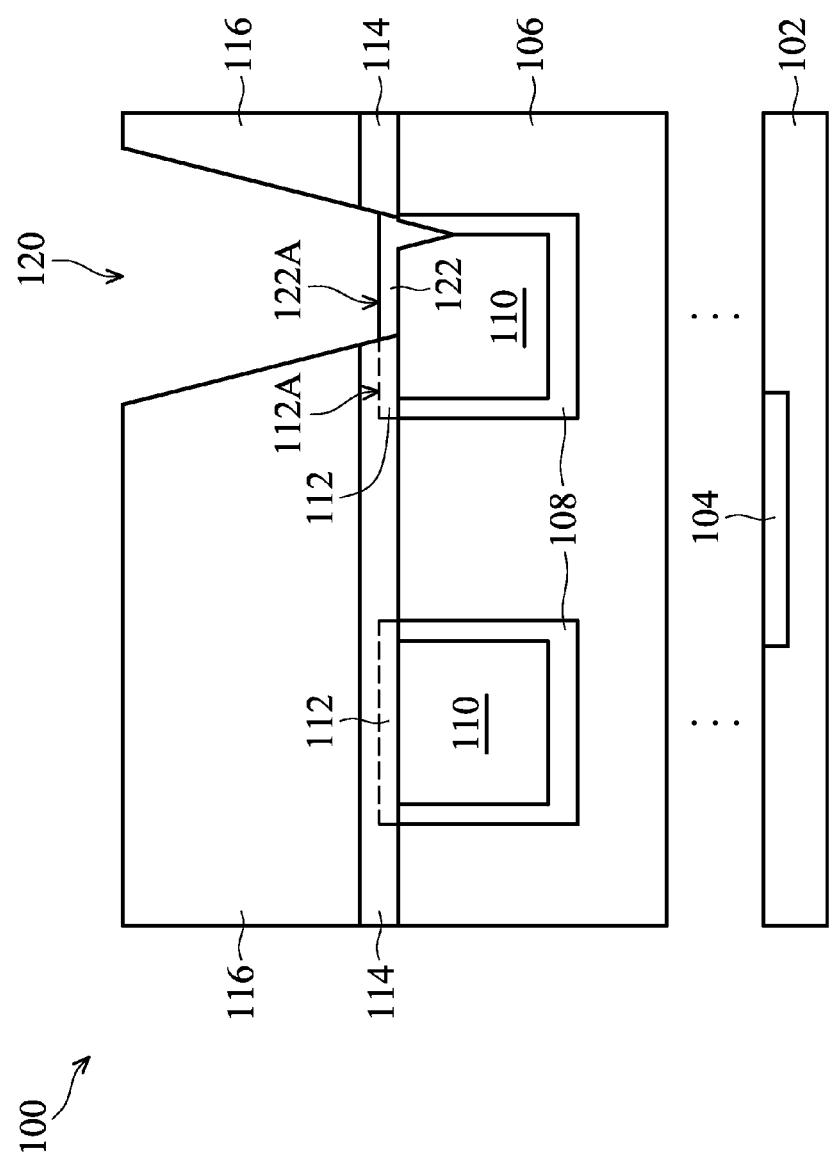
Figure 6:
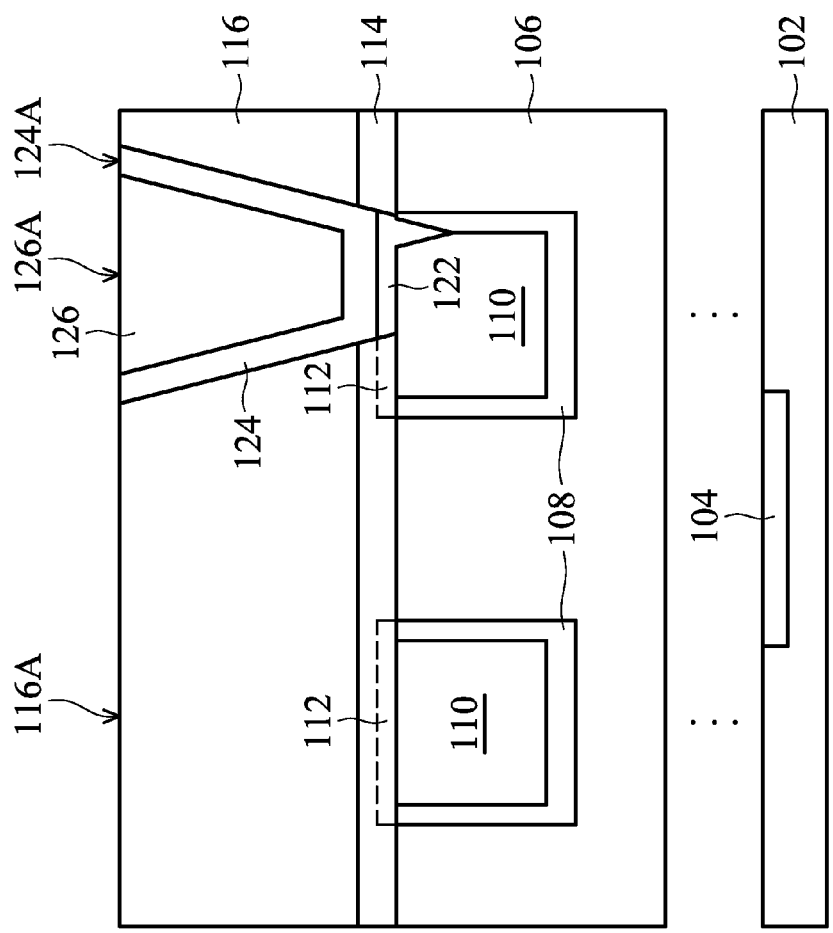
Figure 7:
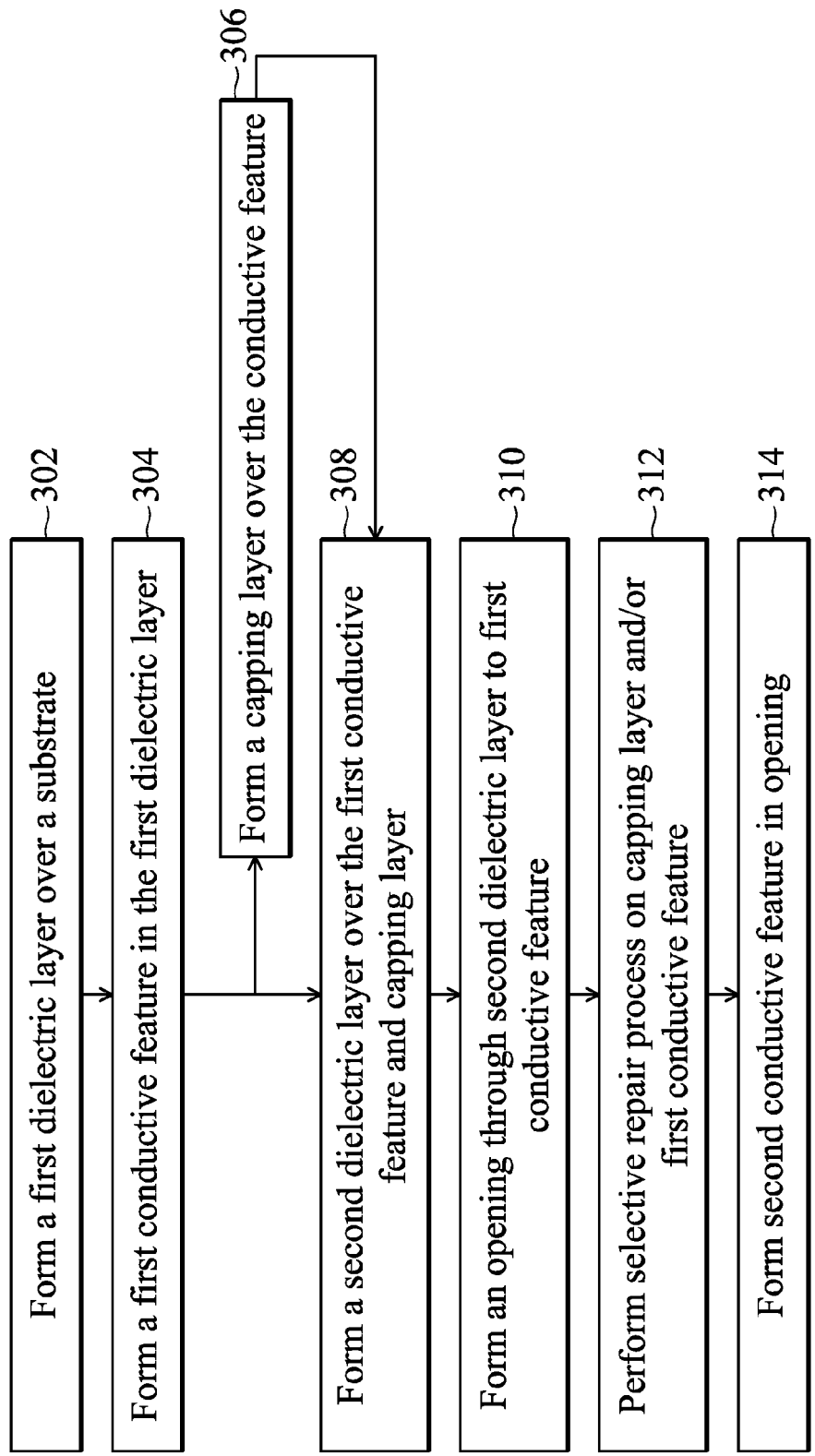
FIG. 7 is a process flow diagram of the process shown in FIGS. 1 through 6 in accordance with an embodiment.

FIGS. 1 through 6 are cross-sectional views of intermediate stages in the manufacturing of a semiconductor device in accordance with an embodiment, and FIG. 7 is a process flow of the process shown in FIGS. 1 through 6 in accordance with an embodiment.

With reference now to FIG. 1, there is shown a semiconductor device 100 at an intermediate stage of processing according to an embodiment. The semiconductor device 100 includes a substrate 102, active and passive devices 104, a dielectric layer 106, a barrier layer 108, and conductive features 110. The substrate 102 may be formed of a semiconductor material such as silicon, germanium, diamond, or the like. Alternatively, compound materials such as silicon germanium, silicon carbide, gallium arsenic, indium arsenide, indium phosphide, silicon germanium carbide, gallium arsenic phosphide, gallium indium phosphide, combinations of these, and the like, may also be used. Additionally, the substrate 102 may be a silicon-on-insulator (SOI) substrate. Generally, an SOI substrate comprises a layer of a semiconductor material such as epitaxial silicon, germanium, silicon germanium, SOI, silicon germanium on insulator (SGOI), or combinations thereof. The substrate 102 may be doped with a p-type dopant, such as boron, aluminum, gallium, or the like, although the substrate may alternatively be doped with an n-type dopant, as is known in the art.

The substrate 102 may include active and passive devices 104. As one of ordinary skill in the art will recognize, a wide variety of devices such as transistors, capacitors, resistors, combinations of these, and the like may be used to generate the structural and functional requirements of the design for the semiconductor device 100. The active and passive devices 104 may be formed using any suitable methods. Only a portion of the substrate 102 is illustrated in the figures, as this is sufficient to fully describe the illustrative embodiments.

A dielectric layer 106 is formed over the substrate 102 (step 302). The dielectric layer 106 may be formed of oxides such as silicon oxide, borophosphosilicate glass (BPSG), undoped silicate glass (USG), fluorinated silicate glass (FSG), low-k dielectrics such as carbon doped oxides, extremely low-k dielectrics such as porous carbon doped silicon dioxide, a polymer such as polyimide, the like, or a combination thereof. The low-k dielectric materials may have k values lower than 3.9. The dielectric layer 106 may be deposited by chemical vapor deposition (CVD), physical vapor deposition (PVD), atomic layer deposition (ALD), a spin-on-dielectric (SOD) process, the like, or a combination thereof. In an embodiment, the dielectric layer 106 is formed directly on a top surface of the substrate 102. In other embodiments, the dielectric layer 106 is formed on intermediate layers and/or structures (not shown) which are on substrate 102. In some embodiments, the dielectric layer 106 is an inter-layer dielectric (ILD).

FIG. 1 illustrates conductive features 110 formed in the dielectric layer 106 (step 304). In some embodiments, the barrier layer 108 and the conductive features 110 are formed in recesses (not shown) in the dielectric layer 106. These recesses may be formed using acceptable photolithography and etching techniques such as, for example, an anisotropic dry etch.

The barrier layer 108 helps to block diffusion of the subsequently formed conductive features 110 into adjacent dielectric materials such as the dielectric layer 106. The barrier layer 108 may be formed of titanium, titanium nitride, tantalum, tantalum nitride, manganese, manganese oxide, cobalt, cobalt oxide, cobalt nitride, nickel, nickel oxide, nickel nitride, silicon carbide, oxygen doped silicon carbide, nitrogen doped silicon carbide, silicon nitride, aluminum oxide, aluminum nitride, aluminum oxynitride, a polymer such as polyimide, polybenzoxazole (PBO) the like, or a combination thereof. The barrier layer 108 may be formed by CVD, PVD, plasma enhanced CVD (PECVD), ALD, SOD, the like, or a combination thereof. In some embodiments, the barrier layer 108 may be omitted.

After the barrier layer 108 is formed in the recesses, the conductive features 110 are formed on the barrier layer 108 in the recesses. In an embodiment, the conductive features 110 are conductive lines and will be referred to as conductive lines 110 hereinafter. The conductive lines 110 may be a part of a metal layer $M_N$ and may be in the first metal layer ($M_1$) over the substrate 102 or may any number metal layer over the substrate 102 (e.g. $M_5$, $M_{10}$, $M_{100}$). The conductive lines 110 may be formed of copper, aluminum, the like, or a combination thereof. The conductive lines 110 may be formed through a deposition process such as electrochemical plating, CVD, PVD, the like, or a combination thereof. In some embodiments, the conductive lines 110 may be formed on a seed layer (not shown), such as a titanium copper alloy. In an embodiment, the conductive lines 110 are formed to a thickness from about 100 Å to about 3000 Å.

In some embodiments, the conductive lines 110 are planarized by a chemical mechanical polish (CMP) process or an etching process. In these embodiments, the conductive lines 110 have top surfaces 110A that are substantially coplanar with the top surface 106A of the dielectric layer 106 and the top surfaces 108A of the barrier layer 108. Although FIG. 1 illustrates two conductive lines 110, there may be more or less conductive lines 110 depending on the number of conductive lines 110 that are desired.

Figure 2:
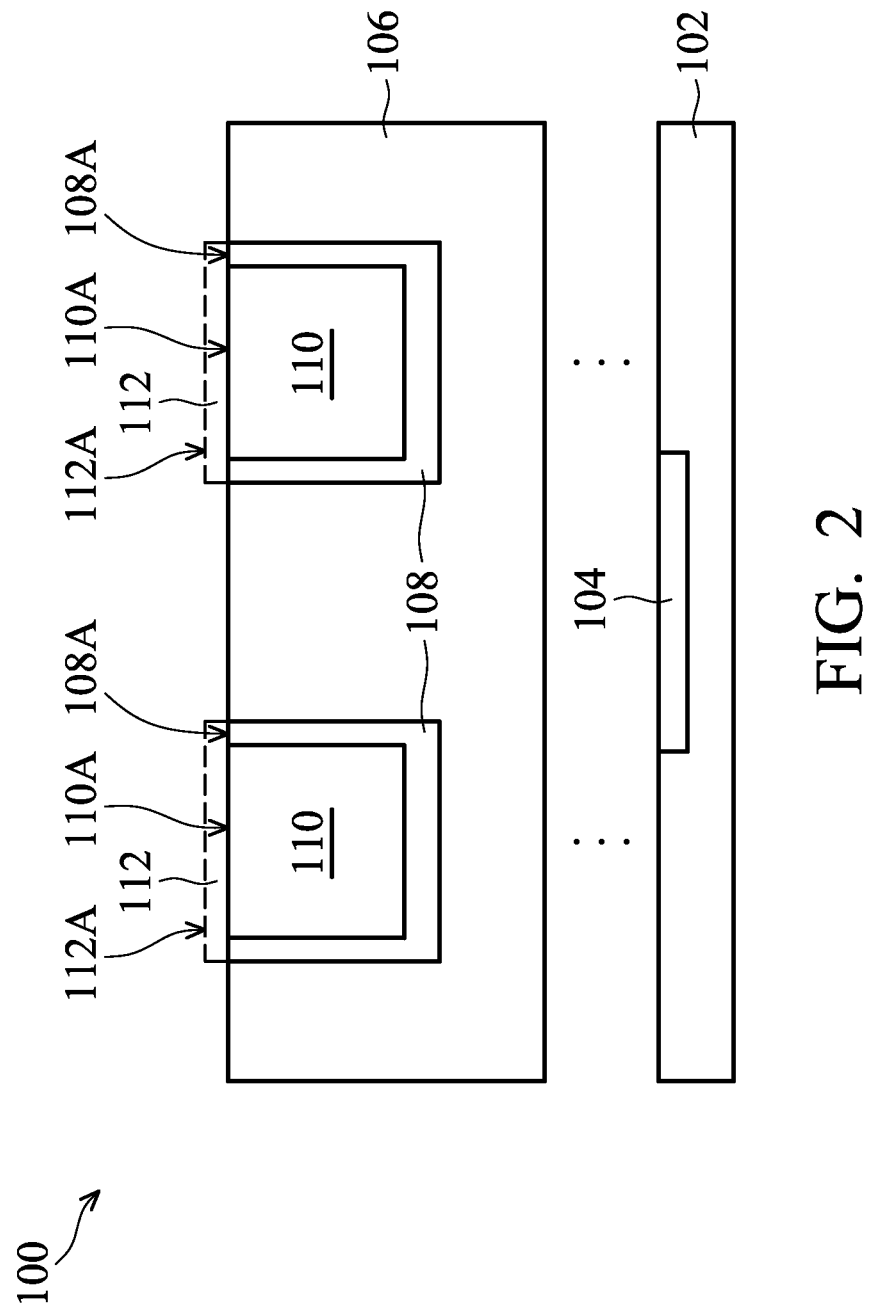

FIG. 2 illustrates forming an optional capping layer 112 over the conductive lines 110 (step 306). The capping layer 112 disposed over the conductive lines 110 and the barrier layer 108 improves electromigration characteristics of the conductive lines 110 and the barrier layer 108. In some embodiments, the capping layer 112 has a thickness ranging from about 5 angstroms to about 50 angstroms formed by a deposition process including low-pressure CVD (LPCVD), CVD, PECVD, plasma-enhanced ALD (PEALD), PVD, sputtering, the like, or a combination thereof. In an embodiment, a top surface 112A of the capping layer 112 is substantially higher than the top surface 110A of the conductive line 110.

The capping layer 112, for example, is a metal-containing layer. In some embodiments, the capping layer 112 includes Co, Cu, W, Al, Mn, Ru, the like, or combinations and alloys thereof. In some embodiments, the capping layer 112 is selectively formed on the conductive lines 110 and barrier layers 108. In other embodiments, the capping layer 112 is formed entirely over the semiconductor device 100 and then subjected to a patterning process to remove the portion of capping layer 112 on the dielectric layer 106, while leaving another portion of capping layer 112 on the conductive lines 110 and barrier layers 108. In some embodiments, the capping layer 112 is omitted.

Figure 3:
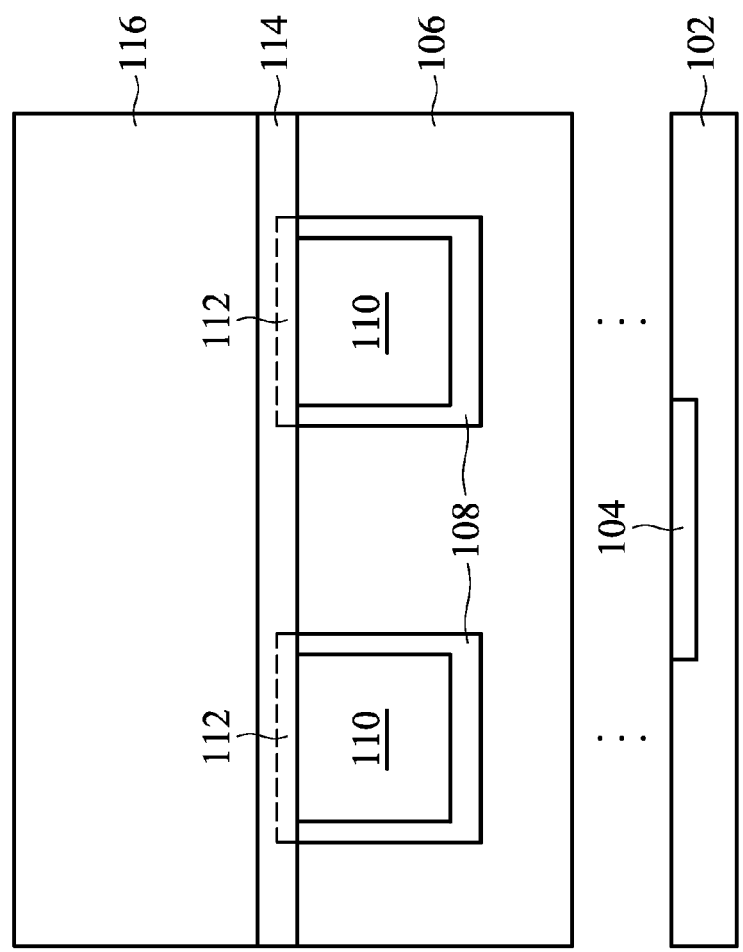

FIG. 3 illustrates the formation of an etch stop layer (ESL) 114 and a dielectric layer 116 over the conductive lines 110 and, if present, the capping layers 112 (step 308). The ESL 114 acts as an etch stop layer for the subsequent formation of conductive feature 126 to the conductive line 110 (see FIGS. 4 through 6). The ESL 114 may be made of one or more suitable dielectric materials such as silicon oxide, silicon carbide, oxygen doped silicon carbide, nitrogen doped silicon carbide, silicon nitride, aluminum oxide, aluminum nitride, aluminum oxynitride, combinations of these, or the like. The ESL 114 may be deposited through a process such as CVD, an SOD process, although any acceptable process may be utilized to form the ESL 114.

The dielectric layer 116 is formed over the ESL 114. The dielectric layer 116 may be formed of oxides such as silicon oxide, BPSG, USG, FSG, low-k dielectrics such as carbon doped oxides, extremely low-k dielectrics such as porous carbon doped silicon dioxide, a polymer such as polyimide, the like, or a combination thereof. The low-k dielectric materials may have k values lower than 3.9. The dielectric layer 116 may be deposited by CVD, PVD, ALD, an SOD process, the like, or a combination thereof. In some embodiments, the dielectric layer 116 is an ILD.

Figure 4:
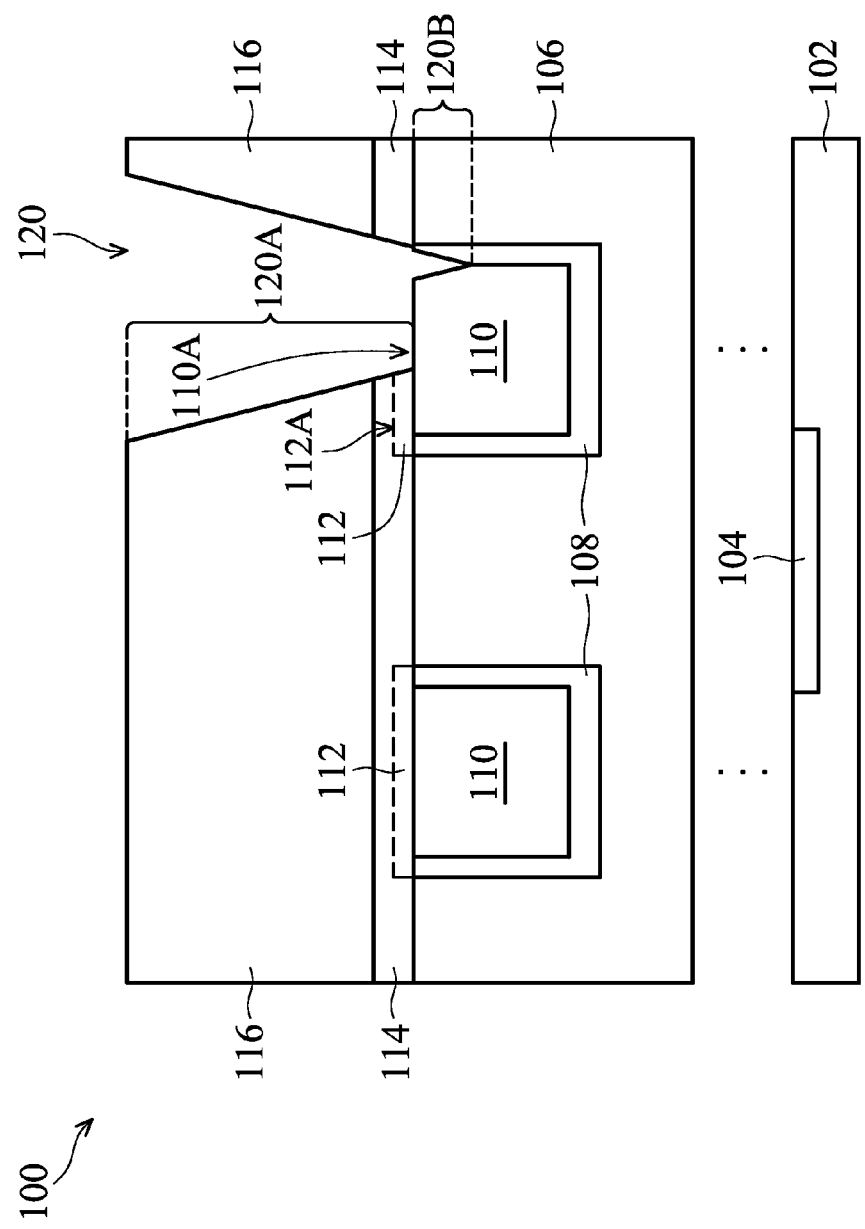

FIG. 4 illustrates the formation of an opening 120 through the dielectric layer 116 to the conductive line 110 (step 310). The opening 120 is formed through the dielectric layer 116 and the ESL 114 to expose portions of the capping layer 112 (if present) and/or the conductive line 110. The opening 120 allows for the electrical and physical coupling between conductive line 110 and the subsequently formed conductive feature 126 (see FIG. 6). As illustrated in FIG. 4, the opening 120 includes an upper portion 120A—above the top surface 110A of the conductive line 110—and a lower portion 120B—below the top surface 110A of the conductive line 110. The opening 120 may be formed using a suitable photolithographic mask and etching process, although any suitable process to expose portions of the capping layer 112 (if present) and/or conductive line 110 may be used.

In some embodiments, the upper portion 120A is the desired portion of the opening 120 with the lower portion 120B being the undesired and/or damage portion of the opening 120. For example, in some embodiments, it is desired that the capping layer 112 remain on the conductive line 110 such that the capping layer 112 may improve the adhesion and the electromigration characteristics of the conductive line 110 and the subsequently formed conductive feature 126. However, in some embodiments, due to the etching process to form the opening 120, the capping layer 112 is partially removed and the conductive line 110 and the barrier layer 108 are also partially removed. In these embodiments, portions of the top surface 110A of the conductive line 110 are exposed. In some embodiments, after the formation of the opening 120, the top surface 110A of the conductive line 110 is non-planar due to damage from the formation of the opening 120.

FIG. 5 illustrates the formation of a capping layer 122 is to repair the capping layer 112 (if present), the conductive line 110, and barrier layer 108 which was removed and/or damaged during the formation of the opening 120 (step 312). In some embodiments, the capping layer 122 fills the lower portion 120B of the opening 120 and has sidewalls which adjoin sidewalls of the ESL 114. In an embodiment, the capping layer 122 has a non-planar bottom surface with a portion of the bottom surface being lower than the top surface 110A of the conductive line 110. In some embodiments, the capping layer 122 has a thickness less than 1000 angstroms, and in an embodiment, the capping layer 122 has a thickness ranging from about 10 angstroms to about 100 angstroms. The capping layer 122 is formed by a selective deposition process including PECVD, PEALD, LPCVD, CVD, PVD, sputtering, the like, or a combination thereof. In an embodiment with the capping layer 112 present, a top surface 122A of the capping layer 122 is substantially coplanar with the top surface 112A of the capping layer 112. In other embodiments with the capping layer 112 present, the top surface 122A of the capping layer 122 is lower or higher than the top surface 112A of the capping layer 112.

The capping layer 122, for example, is a metal-containing layer. In some embodiments, the capping layer 122 includes Co, Cu, W, Al, Mn, Ru, the like, or combinations and alloys thereof. The capping layer 122 is selectively formed on the conductive lines 110, barrier layers 108, and/or the capping layer 112 and not formed on the dielectric layer 116 and the ESL 114 due to the material properties of the different layers. For example, it has been found that the formation of a Co layer on a Cu surface by a gas comprising cyclopentadienylcobalt dicarbonyl ($CpCo(CO)_2$) requires about 20 kcal/mol of activation energy for the reaction to occur on the Cu surface, while formation of a Co layer on a dielectric surface, such as silicon oxide, by a gas comprising CpCo $(CO)_2$ requires about 100 kcal/mol of activation energy for the reaction to occur on the dielectric surface. Thus, the reaction rate (deposition rate) of the Co layer is greater on the Cu surface than the dielectric surface. In an embodiment, the capping layer 112 is formed by a similar selective deposition process as the capping layer 122. In some embodiments, the capping layer 122 and the capping layer 112 have a same material composition. In other embodiments, the capping layer 122 and the capping layer 112 have a different material composition.

FIG. 6 illustrates the formation of the conductive features 126 in the opening 120 (step 314). A barrier layer 124 is formed in the opening 120 and on the capping layer 122. The barrier layer 124 helps to block diffusion of the subsequently formed conductive feature 126 into adjacent dielectric materials such as the dielectric layer 116. The barrier layer 124 may be formed of titanium, titanium nitride, tantalum, tantalum nitride, manganese, manganese oxide, cobalt, cobalt oxide, cobalt nitride, nickel, nickel oxide, nickel nitride, silicon carbide, oxygen doped silicon carbide, nitrogen doped silicon carbide, silicon nitride, aluminum oxide, aluminum nitride, aluminum oxynitride, a polymer such as polyimide, PBO, the like, or a combination thereof. The barrier layer 124 may be formed by CVD, PVD, PECVD, ALD, SOD, the like, or a combination thereof. In some embodiments, the barrier layer 124 may be omitted.

After the barrier layer 124 is formed in the opening 120, the conductive feature 126 is formed in the opening 120 on the barrier layer 124. In an embodiment, the conductive feature 126 is a conductive via between the conductive lines 110 and conductive features in layers above and will be referred to as a conductive via 126 hereinafter. The conductive via 126 may be formed of copper, aluminum, the like, or a combination thereof. The conductive via 126 may be formed through a deposition process such as electrochemical plating, CVD, PVD, the like, or a combination thereof. In some embodiments, the conductive via 126 is formed on a seed layer (not shown), such as a titanium copper alloy.

In some embodiments, the conductive via 126 is planarized by a CMP process or an etching process. In these embodiments, the conductive via 126 has a top surface 126A that is substantially coplanar with the top surface 116A of the dielectric layer 116 and the top surfaces 124A of the barrier layer 124. Although FIG. 6 illustrates one conductive via 126 coupled to one conductive line 110, there may be another conductive via 126 coupled to the other conductive line 110 or more than one conductive via 126 for each conductive line 110 depending on the number of conductive vias 126 that are desired.

Figure 8:
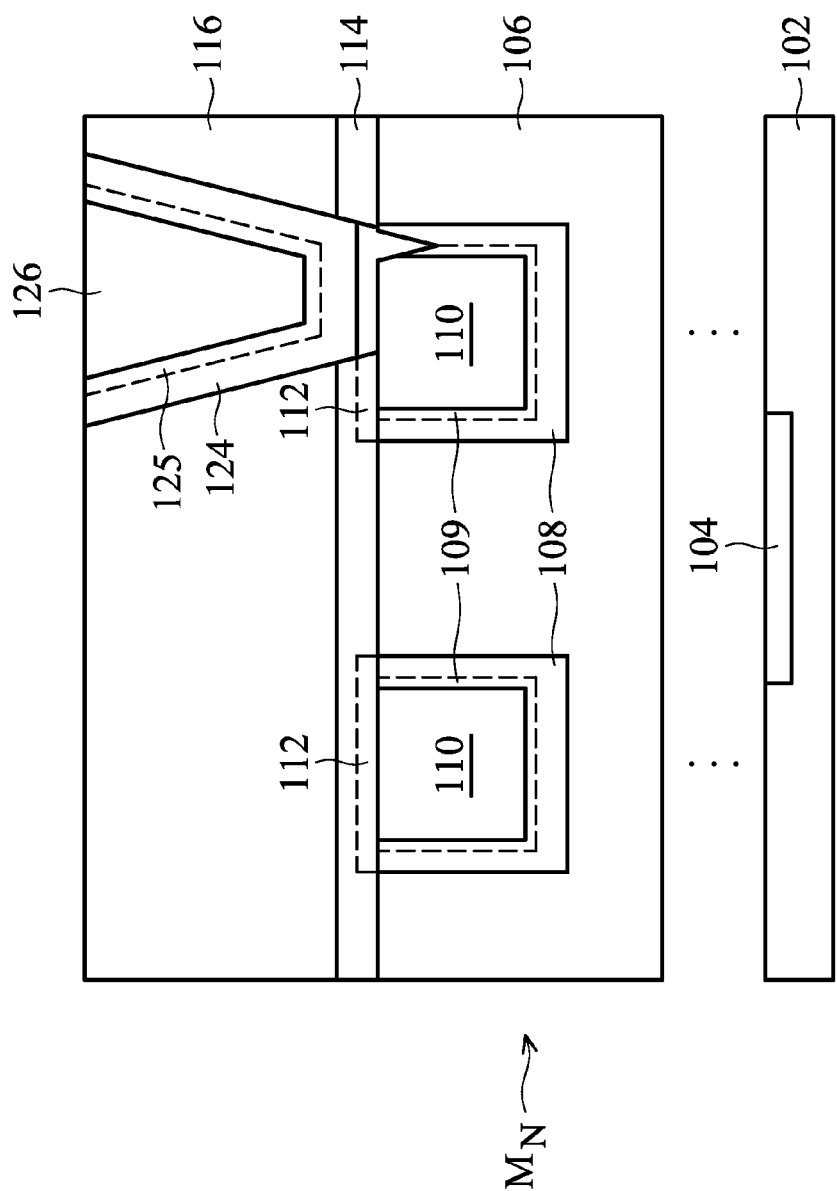
FIG. 8 is a cross-sectional view of a semiconductor device in accordance with an embodiment.

FIG. 8 illustrates a semiconductor device 200 according to an embodiment. The semiconductor device 200 is similar to the semiconductor device 100 except that conductive lines include an optional liner 109 between the barrier layers 108 and the conductive lines 110 and the conductive via 126 includes an optional liner 125 between the barrier layer 124 and the conductive via 126. Details regarding this embodiment that are similar to those for the previously described embodiment will not be repeated herein.

The optional liners 109 and 125 may improve the adhesion between the conductive features 110 and 126 and the barrier layers 108 and 124, respectively. The liners 109 and 125 may be formed of cobalt, titanium, tantalum, tungsten, the like, or a combination thereof. The liners 109 and 125 may be formed by CVD, PVD, PECVD, ALD, SOD, the like, or a combination thereof.

By forming the capping layer 122 in the opening 120, the damage caused by the formation of the opening 120 is repaired. The etching process to form the opening 120 may partially or completely remove the capping layer 112 (if present). It may also partially remove the conductive line 110 and the barrier layer 108. The capping layer 122 repairs this damage and allows for better adhesion between the conductive line 110 and the barrier layer 124 of the conductive via 126 above. Also, the capping layer 122 may fill in any recesses or crevices formed in the conductive line 110 and/or barrier layer 108 which will improve the reliability of the semiconductor device. The capping layer 122 may be formed by a selective process which only forms on the conductive line 110, the barrier layer 108, and the capping layer 112 and not on the dielectric layers 116 and 106 or the ESL 114. Also, due to the selective process, there is no need for an extra mask or etch process for the repair process.

An embodiment is a method for of forming a semiconductor device, the method including forming a first conductive feature over a substrate, forming a dielectric layer over the conductive feature, and forming an opening through the dielectric layer to the first conductive feature. The method further includes selectively forming a first capping layer over the first conductive feature in the opening, and forming a second conductive feature on the first capping layer.

Another embodiment is a method of forming a semiconductor device, the method including forming a first dielectric layer over a substrate, forming a conductive line in the first dielectric layer, forming an etch stop layer over the conductive line and the first dielectric layer, and forming a second dielectric layer over the etch stop layer. The method further includes forming an opening through the second dielectric layer and the etch stop layer to the conductive line, repairing the conductive line in the opening, and forming a conductive via in the opening over the repaired conductive line.

A further embodiment is a semiconductor device including a conductive line over a substrate, and a capping layer on a top surface of the conductive line, the capping layer having a bottom surface lower than a top surface of the conductive line. The semiconductor device further includes a first dielectric layer over the capping layer, and a conductive via contacting a top surface of the capping layer, the conductive via being embedded in the first dielectric layer.

Although the present embodiments and their advantages have been described in detail, it should be understood that various changes, substitutions, and alterations can be made herein without departing from the spirit and scope of the disclosure as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method of forming a semiconductor device, the method comprising:
   forming a first conductive feature over a substrate;
   forming a dielectric layer over the first conductive feature;
   forming an opening through the dielectric layer to the first conductive feature, wherein a first lateral extent of the opening substantially adjoins a second lateral extent of the first conductive feature;
   before forming a barrier layer on sidewalls of the opening, forming a first capping layer over the first conductive feature in the opening, wherein forming the first capping layer comprises selectively depositing a first material that has a lower surface activation energy for binding to the first conductive feature than for binding to the dielectric layer, wherein the first material is disposed on the first conductive feature and is not substantially disposed on sidewall surfaces of the opening above an upper-most surface of the first capping layer;
   after forming the first capping layer, forming the barrier layer on sidewall surfaces of the opening above the upper-most surface of the first capping layer; and
   after forming the barrier layer, forming a second conductive feature on the first capping layer, wherein the first material is different from a second material used to form the second conductive feature.

2. The method of claim 1, wherein forming the opening through the dielectric layer to the first conductive feature removes portions of the first conductive feature, and wherein forming the first capping layer over the first conductive feature replaces at least a portion of removed portions of the first conductive feature.

3. The method of claim 1 further comprising:
   before forming the dielectric layer over the first conductive feature, forming a second capping layer on the first conductive feature.

4. The method of claim 3, wherein forming the opening through the dielectric layer to the first conductive feature removes portions of the second capping layer, and wherein forming the first capping layer over the first conductive feature replaces removed portions of the second capping layer.

5. The method of claim 3, wherein the first capping layer has a top surface substantially coplanar with a top surface of the second capping layer.

6. The method of claim 3, wherein the first capping layer and the second capping layer have a same material composition.

7. The method of claim 3, wherein the first capping layer and the second capping layer have a different material composition.

8. The method of claim 1, wherein the first capping layer is a cobalt layer formed using cyclopentadienylcobalt dicarbonyl.

9. The method of claim 1 further comprising forming an etch stop layer over the first conductive feature, the opening extending through the etch stop layer.

10. The method of claim 9, wherein a sidewall of the first capping layer adjoins a sidewall of the etch stop layer.

11. A method of forming a semiconductor device, the method comprising:
    forming a first dielectric layer over a substrate;
    forming a conductive line in the first dielectric layer;
    forming an etch stop layer over the conductive line and the first dielectric layer;
    forming a second dielectric layer over the etch stop layer;
    forming an opening through the second dielectric layer and the etch stop layer to the conductive line, wherein forming the opening damages a lateral extent of the conductive line below a top surface of the conductive line;
    after forming the opening and before forming a barrier layer on sidewalls of the opening, repairing the conductive line by selectively depositing a first material that has a lower surface activation energy for binding to the conductive line than for binding to at least one of the first dielectric layer or the second dielectric layer, wherein the first material is disposed on the conductive line and is not substantially disposed on sidewall surfaces of the opening above an upper-most surface of the first material;
    after repairing the conductive line, forming the barrier layer on sidewall surfaces of the opening above the upper-most surface of the first material; and
    after forming the barrier layer, forming a conductive via in the opening over the conductive line, wherein the first material is different from a second material used to form the conductive via.

12. The method of claim 11, wherein repairing the damaged conductive line comprises performing a selective deposition of cyclopentadienylcobalt dicarbonyl.

13. The method of claim 11 further comprising:
    before forming an etch stop layer over the conductive line and the first dielectric layer, forming a capping layer over the conductive line; and
    repairing the capping layer in the opening.

14. The method of claim 13, wherein the steps of repairing the capping layer in the opening and repairing the conductive line are performed at a same time by a same process.

15. The method of claim 13, wherein forming the opening through the second dielectric layer and the etch stop layer to the conductive line removes portions of the conductive line, and wherein after repairing the conductive line, the conductive line has a top surface substantially coplanar to a top surface of the capping layer.

16. The method of claim 11, wherein a repaired portion of the conductive line has a bottom surface that is lower than a top surface of the conductive line.

17. The method of claim 11 further comprising:
    before forming the conductive line in the first dielectric layer, forming a barrier layer in the first dielectric layer and forming a liner layer on the barrier layer, wherein the conductive line is formed on the liner layer.

18. A method comprising:

forming a first dielectric layer over a substrate;

forming a conductive line in the first dielectric layer;

forming a first barrier layer, at least a portion of the first barrier layer adjacent the conductive line;

selectively forming a capping layer on the conductive line;

forming an etch stop layer over the capping layer, the conductive line, the first barrier layer, and the first dielectric layer;

forming a second dielectric layer over the etch stop layer;

forming an opening through the second dielectric layer, the etch stop layer, and the capping layer to the conductive line, wherein forming the opening removes at least a portion of the conductive line and at least a portion of the first barrier layer below an upper-most surface of the conductive line;

first barrier layer and the conductive line by selectively depositing a first material that has a lower surface activation energy for binding to the conductive line than for binding to at least one of the first dielectric layer or the second dielectric layer, wherein the first material is disposed on the conductive line and is not substantially disposed on sidewall surfaces of the opening above an upper-most surface of the first material;

after repairing the first barrier layer and the conductive line, forming a second barrier layer on sidewall surfaces of the opening; and after forming the second barrier layer, forming a conductive via in the opening over the second barrier layer, the capping layer, and the conductive line, wherein the first material is different from a second material used to form the conductive via.

19. The method of claim 18, wherein the first material comprises cyclopentadienylcobalt dicarbonyl.

20. The method of claim 18, wherein a sidewall of the capping layer adjoins a sidewall of the etch stop layer.

* * * * *